(12) United States Patent
Elbanhawy

(10) Patent No.: US 7,199,435 B2
(45) Date of Patent: Apr. 3, 2007

(54) SEMICONDUCTOR DEVICES CONTAINING ON-CHIP CURRENT SENSOR AND METHODS FOR MAKING SUCH DEVICES

(75) Inventor: Alan Elbanhawy, Hollister, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/682,107

(22) Filed: Oct. 9, 2003

(65) Prior Publication Data

US 2004/0140514 A1    Jul. 22, 2004

Related U.S. Application Data

(60) Provisional application No. 60/417,436, filed on Oct. 9, 2002.

(51) Int. Cl.
  *H01L 29/82* (2006.01)
  *G01R 31/26* (2006.01)
(52) U.S. Cl. .................. 257/427; 257/379; 438/18
(58) Field of Classification Search ............... 257/421, 257/427, 379, 536; 438/18, 238
See application file for complete search history.

(56) References Cited

U.S. PATENT DOCUMENTS

| | | | |
|---|---|---|---|
| 4,686,472 A | 8/1987 | Van Ooijen et al. ........ 324/252 |
| 5,023,684 A * | 6/1991 | Tsunoda ..................... 257/423 |
| 5,640,343 A * | 6/1997 | Gallagher et al. .......... 365/171 |
| 5,905,611 A | 5/1999 | Yoda et al. ............... 360/324.1 |
| 5,914,839 A | 6/1999 | Matsuzono et al. ......... 360/315 |
| 5,990,533 A * | 11/1999 | Hasegawa ................... 257/421 |
| 6,252,395 B1 * | 6/2001 | Aoyama et al. ....... 324/207.12 |
| 6,452,762 B1 | 9/2002 | Hayashi et al. .......... 360/324.1 |
| 6,493,194 B1 | 12/2002 | Sakaguchi et al. .......... 360/322 |
| 6,580,270 B1 | 6/2003 | Coehoorn ................... 324/252 |
| 6,891,241 B2 * | 5/2005 | Kim et al. .................. 257/421 |
| 2004/0140514 A1* | 7/2004 | Elbanhawy ................ 257/427 |

* cited by examiner

*Primary Examiner*—Mark V. Prenty
(74) *Attorney, Agent, or Firm*—Kirton & McConkie; Kenneth E. Horton

(57) ABSTRACT

Semiconductor devices containing a MOSFET and an on-chip current sensor in the form of a magnetic resistive element are described. The magnetic resistive element (MRE) is proximate the MOSFET in the semiconductor device. The current flowing through the MOSFET generates a magnetic field that is detected by the MRE. The MRE comprises a metal film that is placed proximate the MOSFET during the normal fabrication processes, thereby adding little to the manufacturing complexity or cost. Using the MRE adds an accurate, effective, and cheap method to measure currents in MOSFET devices.

31 Claims, 5 Drawing Sheets

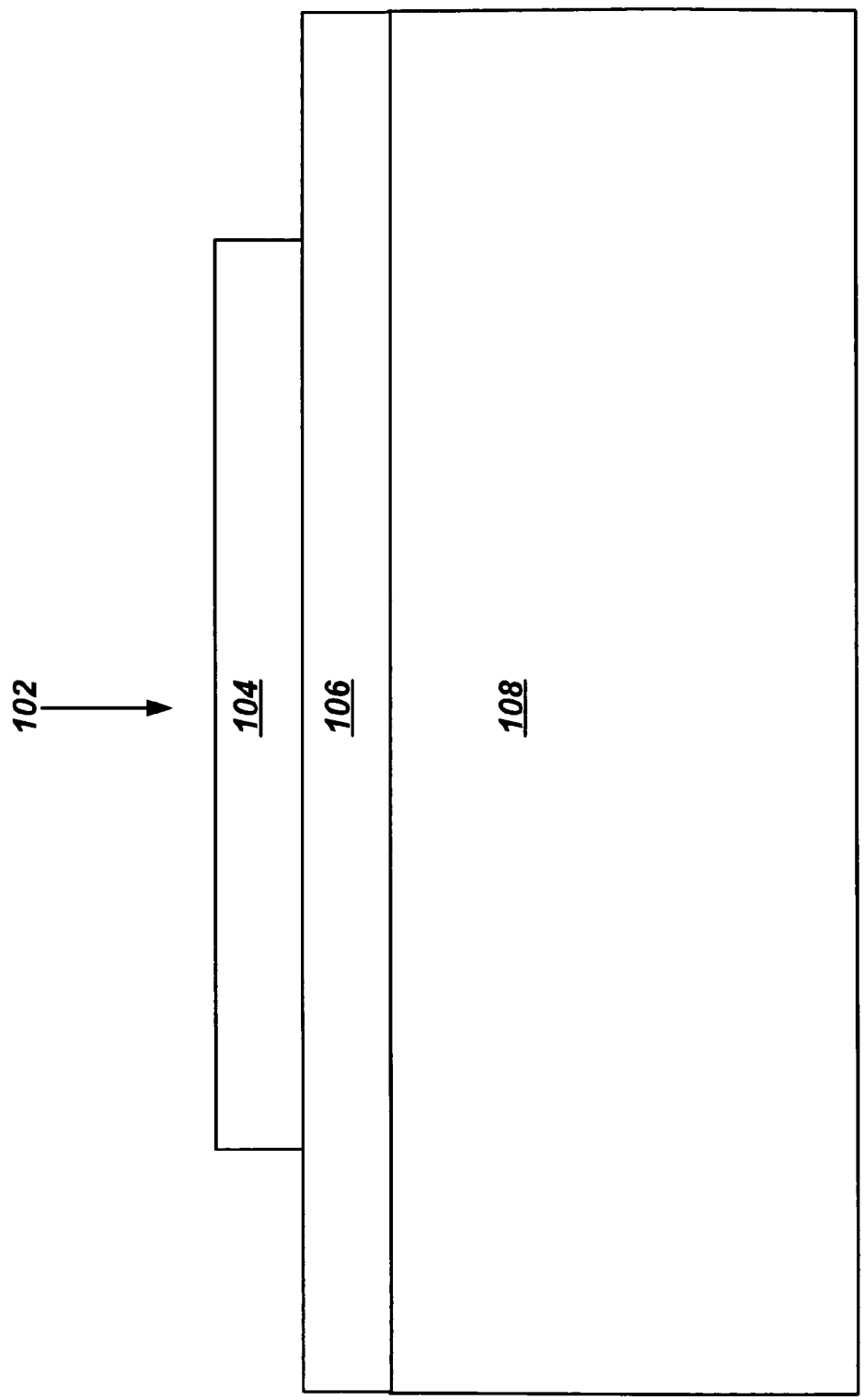

SEMICONDUCTOR DEVICES CONTAINING ON-CHIP CURRENT SENSOR AND METHODS FOR MAKING SUCH DEVICES

CROSS-REFERENCE TO RELATED APPLICATIONS

This application claims priority of U.S. Provisional Patent Application No. 60/417,436 (filed 09 Oct. 2002), the entire disclosure of which is incorporated herein by reference.

FIELD OF THE INVENTION

The invention generally relates to methods for fabricating integrated circuits (ICs) and semiconductor devices and the resulting structures. More particularly, the invention relates to semiconductor devices containing MOSFETs with an on-chip current sensor and methods for making such semiconductor devices. Even more particularly, the invention relates to semiconductor devices containing MOSFETS with an on-chip magnetic resistive element as a current sensor and methods for making such devices.

BACKGROUND OF THE INVENTION

In IC fabrication, devices such as transistors may be formed on a semiconductor wafer or substrate, which is typically made of silicon. MOSFET devices are widely used in numerous electronic apparatus, including automotive electronics, disk drives and power supplies. These MOSFET devices often function as switches and are used to connect a power supply to a load.

The current flowing between the source regions and the drain region of MOSFET devices has often been measured using several mechanisms. Examples of such conventional mechanisms include using a sensing field effect transistors (SENSFETs), using sense resistors, or by measuring the voltage drop across the "on resistance" ($R_{DS(on)}$). In a SENSFET, the source current is separated into a main circuit conducting the main current and a parallel measuring circuit.

These known mechanisms and devices unfortunately have several disadvantages. SENSFETs are expensive to manufacture and are not isolated from the MOSFET device, thereby complicating the operation of the semiconductor device containing them. Sense resistors, while being accurate, are disadvantageous because of the accompanying power dissipation. Measuring the current by using the voltage drop across $R_{DS(on)}$ has a low accuracy because of the statistical distribution (20–30%) of $R_{DS(on)}$ that results because of the particular MOSFET used. As well, the voltage drop mechanism is not very accurate because the $R_{DS(on)}$ depends on the temperature and can vary widely (i.e., 40–50% over a 100 degrees Celsius temperature range).

SUMMARY OF THE INVENTION

The invention provides semiconductor devices containing a MOSFET and an on-chip current sensor in the form of a magnetic resistive element. The magnetic resistive element (MRE) is proximate the MOSFET in the semiconductor device. The current flowing through the MOSFET generates a magnetic field that is detected by the MRE. The MRE comprises a metal film that is placed proximate the MOSFET during the normal fabrication processes, thereby adding little to the manufacturing complexity or cost. Using the MRE adds an accurate, effective, and cheap method to measure currents in MOSFET devices.

The invention includes a semiconductor device containing a MOSFET and an on-chip magnetic resistive element proximate the MOSFET. The invention also includes an on-chip current sensor for a current-carrying component of a semiconductor device, the sensor comprising a magnetic resistive element proximate a portion of the current-carrying component. The invention further includes a semiconductor device containing a MOSFET and an on-chip magnetic resistive element located proximate the MOSFET that senses the current flowing through the MOSFET. The invention still further includes electronic apparatus containing such devices.

The invention embraces a method for making a semiconductor device by providing a MOSFET and then providing an on-chip magnetic resistive element proximate the MOSFET. The invention also embraces a method for making a semiconductor device by forming a MOSFET structure and then providing an on-chip magnetic resistive element by forming an insulating layer on a portion of the MOSFET structure and then forming a first conductive layer on a portion of the insulating layer. The invention further embraces a method for sensing a current in a semiconductor device by providing a semiconductor device containing a current-carrying component, providing an on-chip current sensor containing a magnetic resistive element with an initial direction of magnetization, and then measuring the resistance in the magnetic resistive element as the current flows through the current-carrying component.

BRIEF DESCRIPTION OF THE DRAWINGS

FIGS. 1–6 are views of one aspect of the devices and methods of making the devices according to the invention, in which:

FIG. 1 illustrates a simplified top view of a semiconductor device in one aspect of the invention;

FIG. 2 illustrates a simplified side view of a semiconductor device in one aspect of the invention;

FIGS. 3 and 4 illustrate the operation of a portion of the semiconductor device in one aspect of the invention;

FIG. 5 depicts a simplified method for making a portion of the semiconductor device in one aspect of the invention; and FIG. 6 illustrates a simplified top view of a semiconductor device in one aspect of the invention.

FIGS. 1–6 presented in conjunction with this description are views of only particular—rather than complete—portions of the devices and methods of making the devices according to the invention. Together with the following description, the Figures demonstrate and explain the principles of the invention. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their descriptions will not be repeated.

DETAILED DESCRIPTION OF THE INVENTION

The following description provides specific details in order to provide a thorough understanding of the invention. The skilled artisan, however, would understand that the invention can be practiced without employing these specific details. Indeed, the invention can be practiced by modifying the illustrated system and method and can be used in conjunction with apparatus and techniques conventionally used in the industry. For example, the invention could be used for other transistor devices and other non-transistor current carrying devices in an IC.

As noted above, the invention generally comprises a semiconductor device containing a magnetic resistive element (MRE) in close proximity to a MOSFET structure. The current flowing through the MOSFET generates a magnetic field that is detected by the MRE because of its proximity to the MOSFET. Any MRE that can operate in combination with a MOSFET structure to measure the current, yet without interfering with the MOSFET operation, can be used in the invention. In one aspect of the invention, the MRE described below is used in the invention.

Figure 1:
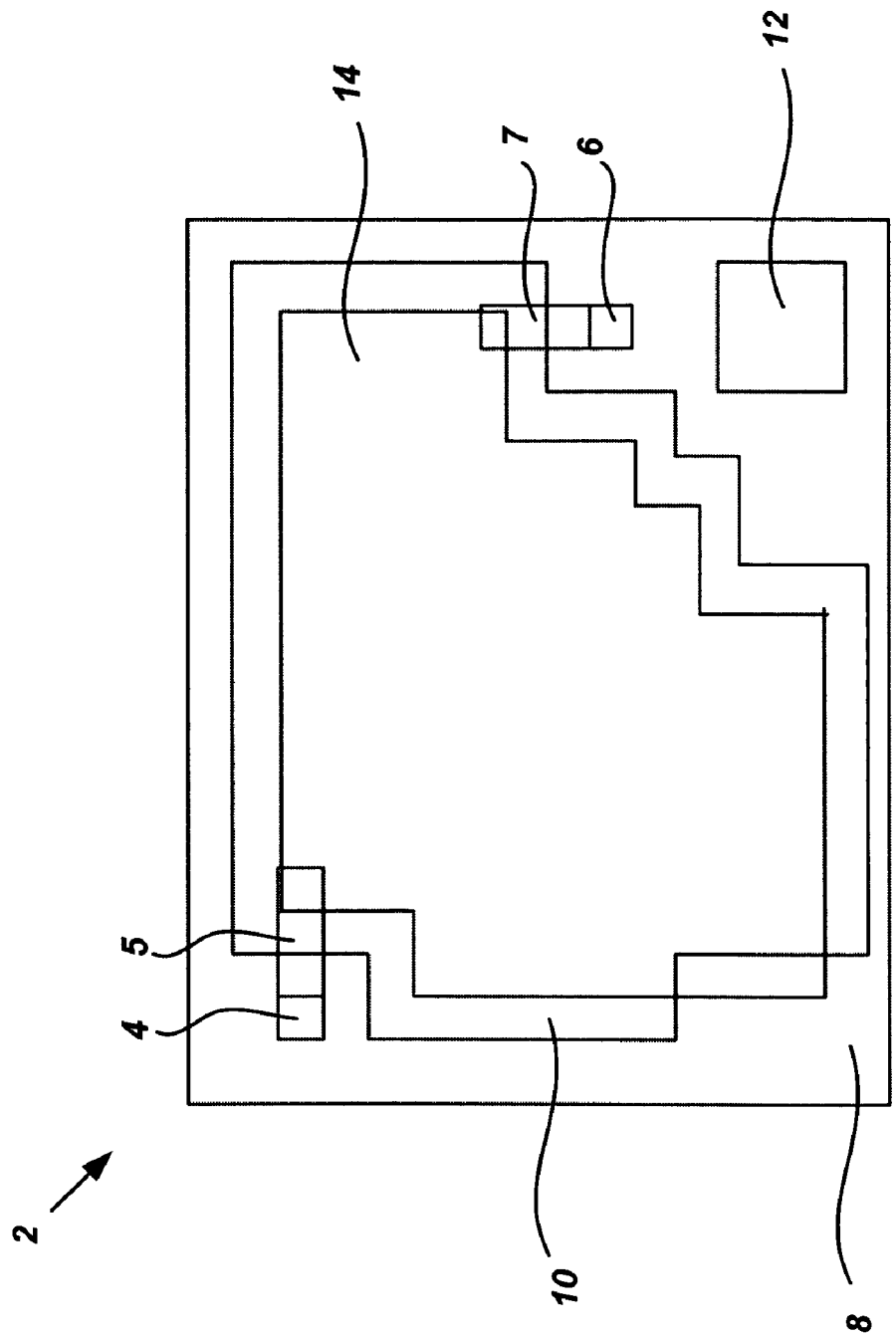
Figure 2:
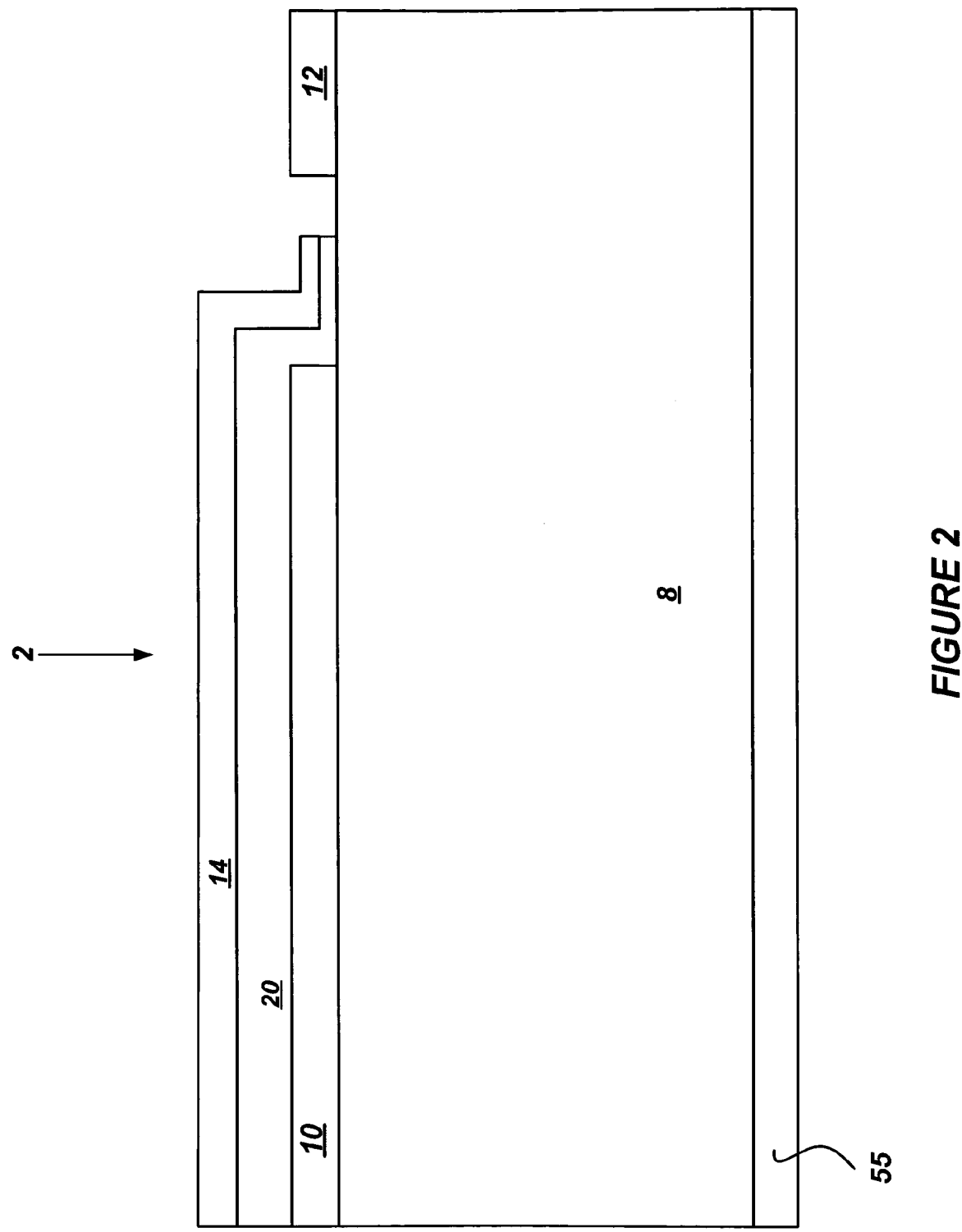

FIGS. 1 and 2 illustrate a semiconductor device containing one combination of an MRE and a MOSFET structure in one aspect of the invention. In these Figures, the semiconductor device 2 contains a semiconductor substrate 8. The substrate 8 may be any known semiconducting substrate known in the art, such as III–V substrates, II–IV substrates, and monocrystalline silicon (Si). In one aspect of the invention, Si is used as the material for the substrate. The substrate 8 can optionally be provided with an epitaxial layer formed thereon as known in the art. In one aspect of the invention, the substrate 8 can be doped as known in the art to modify its conductivity.

The semiconductor device 2 can contain any MOSFET structure known in the art. In one aspect of the invention, the semiconductor device 2 contains a drain 55 of a MOSFET device. Drain 55 can be any structure that operates as a drain region for a MOSFET device. For example, while not depicted completely in the Figures, it is understood that the drain 55 can comprises a metal layer on the substrate 8, dopant regions underlying the metal layer, and/or any other components as known in the art that can be used to form a drain of a MOSFET device.

The semiconductor device 2 also contains a gate 12 of a MOSFET device. Gate 12 can be any gate structure for a MOSFET device as known in the art. For example, while not depicted in the Figures, it is understood that the gate structure contains a gate conductor, gate insulating layer, dopant regions, channel region, and other components as known in the art to form a gate of a MOSFET device.

The semiconductor device 2 also contains a source 10 of a MOSFET device. Source 10 can be any structure that operates as a source region for a MOSFET device. For example, while not depicted completely in the Figures, it is understood that the source 10 comprises a metal layer over the substrate 8, dopant regions underlying the metal layer, and/or any other components as known in the art to form a source of a MOSFET device. The semiconductor device 2 also contains any other necessary components for operation of a MOSFET device.

The semiconductor device 2 of the invention also contains an on-chip MRE that operates as a sensor of the current flowing in the MOSFET. There are numerous MREs that are known in the art and that can be used in the invention. See, for example, U.S. Pat. Nos. 6,580,270, 6,493,194, 5,914,839, 4,686,472, 6,452,762, 5,905,611, and the patents cited therein, the disclosures of which are incorporated herein by reference.

The MRE could be incorporated into the semiconductor device 2 in any manner that allows such current sensing without interfering with the operation of the MOSFET. In one aspect of the invention, the MRE and MOSFET are not integrated and embedded in this manner. In this aspect of the invention, and as illustrated in FIG. 6, the semiconductor device 102 contains a MRE structure 104 that is completely insulated from MOSFET structure 108 by an insulating layer 106. In another aspect of the invention, the MRE is integrated with and embedded within the MOSFET structure as illustrated in FIGS. 1–5 and described below.

The MRE component of the semiconductor device 2 can measure both AC and DC currents up to high frequencies ranging from about DC to about several hundred KHz. At the same time, the MRE component is relatively small compared to the size of the MOSFET as described herein Any MRE component satisfying these criteria can be used in the invention, including the MRE described and illustrated below.

In one aspect of the invention, the MRE component is depicted in FIGS. 1 and 2. The MRE contains a conductive layer 14 that is insulated from the MOSFET structure, including from source 10. The MRE can be insulated in any manner known in the art, including using an insulating layer 20. The insulating layer 20 can be made of any conventional insulating material in the art, such as polyimide, silicon nitride, silicon oxynitride, or silicon oxide (SiO) with a thickness sufficient to provide the desired insulation, i.e., a thickness ranging from about 1 micron to about 50 microns.

The conductive layer 14 can comprise any conductive materials, such as a metal or metal alloy, that function consistent with the description of the MRE herein. Examples of the metal and metal alloys that can be used in conductive layer 14 include nickel-iron or permalloy. In one aspect of the invention, the conductive layer 14 comprises a nickel-iron alloy or a permalloy.

The MRE component of the semiconductor device 2 also contains a plurality of terminals. The terminals provide an input and output mechanism for the MRE. Any terminal known in the art that operates in this manner can be used in the invention, including the terminals 4 and 6 described and depicted herein.

The MRE can contain as many terminals as necessary to enable measurement of the expected or desired current. In one aspect of the invention, the MRE comprises two terminals, e.g., terminals 4 and 6 as shown in FIG. 1. The terminals 4 and 6 are connected to the bulk portion of the MRE element via leads 5 and 7 that can be made as known in the art. In one aspect of the invention, the MRE may be formed as a bridge for accurate resistance measurement and therefore requires 4 terminals.

With this configuration, the devices of the invention have several advantages. First, the MRE component can be completely insulated and can float electrically from the source 10 of the MOSFET. Thus, the MRE operates without interfering with the operation of the MOSFET. Another advantage is that the MRE has good differential sensing and great noise immunity. Thus, the devices of the invention can operate from DC to several hundred KHz.

Figure 3:
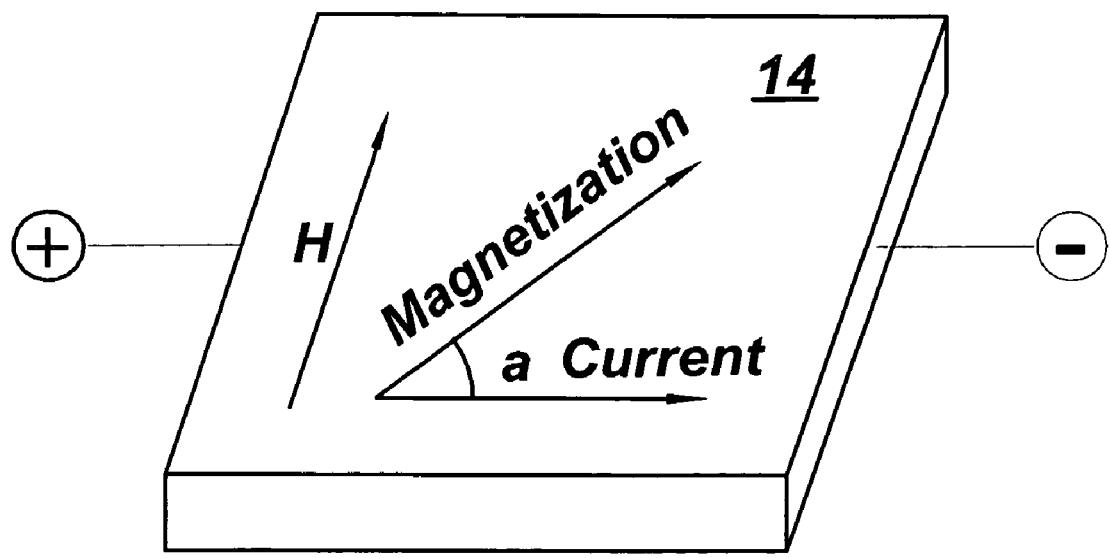

When operated, the conductive material of the conductive layer 14 of the MRE is provided with an initial direction of magnetization. The MRE will change its resistance based on the magnetic field that is generated by the current flowing through the MOSFET. When no current flows through the MOSFET, no magnetic field is generated. Thus, as depicted in FIG. 3, no external magnetic field (H) is present and the conductive layer 14 of the MRE has the initial magnetization vector parallel to the current flow (I).

When current flows through the MOSFET, a magnetic field is generated and impinges on the conductive layer 14 of the MRE. As a result, the resistance (R) of the conductive layer 14 changes as a function of the applied magnetic field.

For example, when an external magnetic field is applied to the MRE and is parallel to the plane of the conductive layer 14, but perpendicular to the current flow of the MOSFET, the internal magnetization vector of the MRE rotates around the angle (a).

This resistance R can be linear or non-linear. In certain instances, it can be desirable to change this non-linearity characteristic to a linear characteristic. In such instances, the non-linearity can be modified by any mechanism known in the art. In one aspect of the invention, this mechanism includes using a second conductive layer 22 Although the second conductive layer 22 can be less conductive, for maximum efficiency it should be more conductive than conductive layer 14. Thus, the second conductive layer 22 can be made of any conductive material with a higher electrical conductivity than the material of the conductive layer 14. For example, when conductive layer 14 comprises permalloy, the conductive layer 22 can comprise aluminum.

Figure 4:
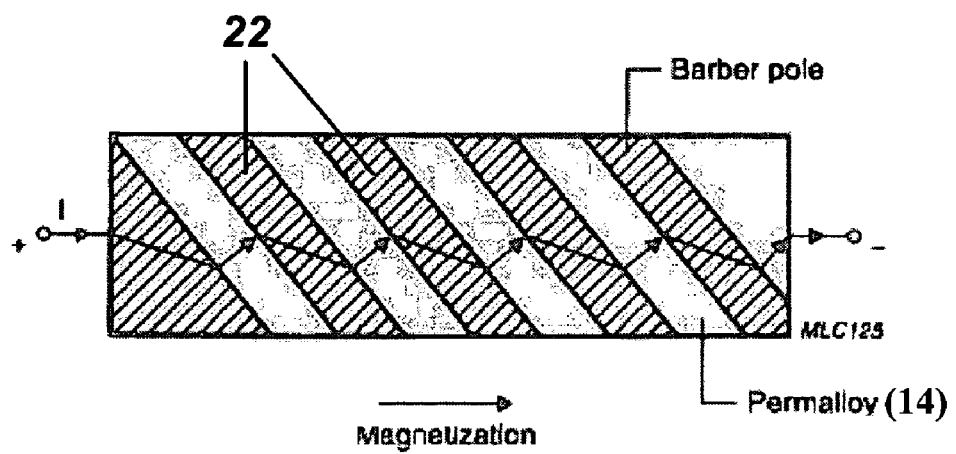

The second conductive layer 22 is configured so that it can rotate the current direction enough to effectively change the rotation angle of the magnetic field relative to the current. In one aspect of the invention, as shown in FIG. 4, this function can be achieved by forming the conductive layer 22 as strips oriented in a direction that will change the current direction enough so that the end result is the desired linearity as described above. The width and thickness of the strips can be configured to obtain the desired change described above and is dependent on the material used in the strips. For example, where the conductive layer 14 is made of permalloy, the conductive layer 22 can be formed as aluminum strips over or on top of the permalloy at 45° to the strip axis as shown in FIG. 4. Because aluminum has a higher conductivity that permalloy, the current direction is rotated 45° and effectively changes the rotation angle of the magnetization.

Using the MRE component in close proximity to the MOSFET as described above provides several advantages. First, the MRE allows very precise and accurate current measurements relative to those currently available. Precise and accurate current measurements are in high demand, especially in DC-DC converter applications. The second advantage is that MRE has excellent sensitivity to magnetic fields. This sensitivity can be about 50–100 times higher than conventional methods that employ the Hall effect. The third advantage is that the MRE can be placed in an isolated or non-isolated configuration, thereby giving greater flexibility. The fourth advantage is that the MRE is linear in operation, or can be configured to become linear in operation. The fifth advantage is that the MRE can be designed to have superior temperature stability at normal operation temperatures, i.e., in the temperate range of −50 degrees Celsius to +150 degrees Celsius. The final advantage (as described below) is that the method of incorporating the MRE into existing fabrication process for making devices containing MOSFETs is simple and inexpensive.

Figure 5:
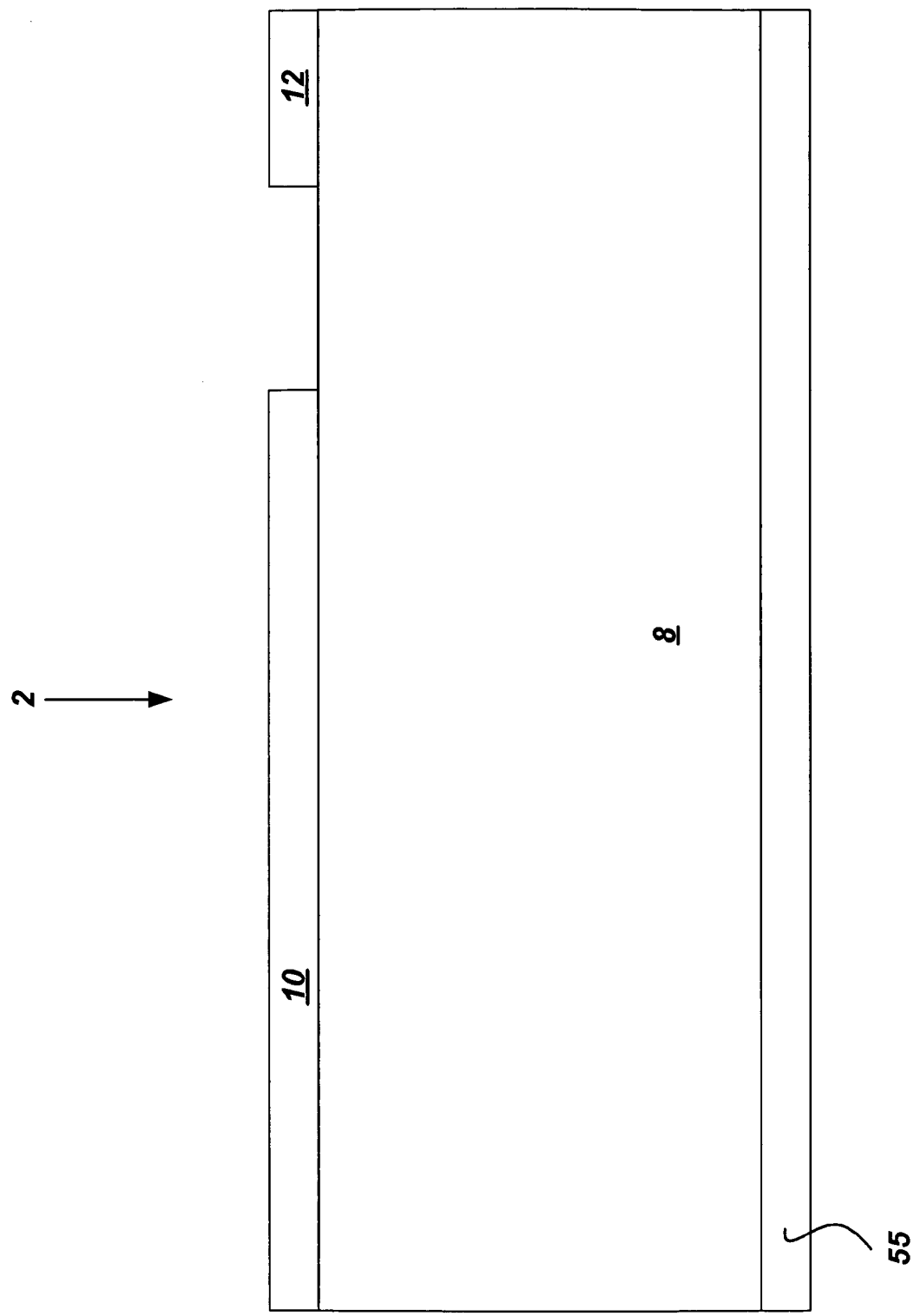

The semiconductor devices containing the MRE in proximity to the MOSFET can be made by any process that results in the structures described herein. In one aspect of the invention, the process described below is used to make the semiconductor devices. First, the MOSFET structure is manufactured. Such processes are well known in the art and will not be repeated here. See, for example, U.S. Pat. Nos. 6,107,127 and 6,429,481, the disclosures of which are incorporated herein by reference. The resulting structure is illustrated in FIG. 5.

After forming the MOSFET, an insulating layer 20 is then formed over source 10 of the MOSFET. The insulating layer 20 can be formed by any deposition and patterning process known in the art. For example, when the insulating layer 20 comprises silicon oxide, it can be deposited by heating the completed MOSFET structure in a gaseous atmosphere containing silicon and oxygen for a time sufficient to form the desired thickness. Then, the insulating layer is patterned by a masking and etching process as known in the art. The thickness of the insulating layer 20 can range from about 5 microns to about 50 microns.

Next, the conductive layer 14 is formed using any suitable deposition and patterning process known in the art. For example, the conductive layer 14 can be blanket deposited by any suitable mechanism, such as sputter deposition. Then, the metal film is patterned by a masking and etching process as known in the art. The patterning process not only provides the shape of the MRE depicted in FIG. 1, but also the terminals (4 and 6) and leads (5 and 7) of the MRE.

When the conductive layer 22 is used as described above, it is formed using any suitable deposition and patterning process known in the art. For example, the material for the conductive layer 22 (i.e., aluminum) can be blanket deposited by any suitable mechanism, such as sputter deposition. Then, the metal film is patterned by a masking and etching process as known in the art.

As known in the art, the semiconductor device 2 can contain other components and subsequent processing as known in the art can be used to include those components. As well, the semiconductor device can be packaged and then included in an electronic device as known in the art.

Having described these aspects of the invention, it is understood that the invention defined by the appended claims is not to be limited by particular details set forth in the above description, as many apparent variations thereof are possible without departing from the spirit or scope thereof.

I claim:

1. A semiconductor device, comprising:
   a MOSFET; and
   an on-chip magnetic resistive element proximate the MOSFET, the magnetic resistive element containing a first conductive layer that is connected to terminals via leads and that is proximate the source of the MOSFET, and a second conductive layer proximate the first conductive layer.

2. The device of claim 1, wherein the magnetic resistive element senses the current flowing through the MOSFET.

3. The device of claim 1, wherein the first conductive layer is insulated from the source of the MOSFET by an insulating layer.

4. The device of claim 3, wherein the second conductive layer is formed on the first conductive layer.

5. The device of claim 1, wherein the first conductive layer is provided with an initial direction of magnetization.

6. An on-chip current sensor for a current-carrying component of a semiconductor device, the sensor comprising a magnetic resistive element that is connected to terminals via leads and that is proximate a portion of the current-carrying component and wherein the magnetic resistive element changes its resistance depending on the magnetic field generated by the current flowing through the current-carrying component.

7. The sensor of claim 6, wherein the magnetic resistive element comprises a first conductive layer that is proximate the portion of the current-carrying component.

8. The sensor of claim 7, wherein the first conductive layer is insulated from the current-carrying component.

9. The sensor of claim 8, wherein the first conductive layer of the magnetic resistive element that is connected to the terminals via leads.

10. The sensor of claim 7, wherein the magnetic resistive element contains a second conductive layer proximate the first conductive layer.

11. The sensor of claim 7, wherein the first conductive layer is provided with an initial direction of magnetization.

12. A semiconductor device, comprising:
a MOSFET; and
an on-chip magnetic resistive element located proximate the MOSFET that senses the current flowing through the MOSFET, wherein the magnetic resistive element comprises a first conductive layer proximate to the MOSFET and insulated from the MOSFET by an insulating layer.

13. The device of claim 12, wherein the magnetic resistive element contains a second conductive layer proximate the first conductive layer.

14. The device of claim 12, wherein the first conductive layer is provided with an initial direction of magnetization.

15. An electronic apparatus comprising a semiconductor device, the semiconductor device containing:
a MOSFET; and
an on-chip magnetic resistive element located proximate the MOSFET that senses the current flowing through the MOSFET, wherein the magnetic resistive element comprises a first conductive layer proximate to the MOSFET and insulated from the MOSFET by an insulating layer.

16. A method for making a semiconductor device, comprising:
providing a MOSFET; and
providing an on-chip magnetic resistive element that is connected to terminals via leads and that is proximate the MOSFET, the magnetic resistive element changing its resistance depending on the current flowing through the MOSFET.

17. A method for making a semiconductor device, comprising:
forming a MOSFET structure; and
providing an on-chip magnetic resistive element proximate the MOSFET that senses the current flowing through the MOSFET, wherein the magnetic resistive element comprises a first conductive layer proximate to the MOSFET and insulated from the MOSFET by an insulating layer.

18. The method of claim 17, further comprising forming the magnetic resistive element by forming an insulating layer on a portion of the MOSFET structure and forming a first conductive layer on a portion of the insulating layer.

19. The method of claim 18, including forming a second conductive layer proximate the first conductive layer.

20. The method of claim 18, including providing the magnetic resistive element with terminals connected to the first conductive layer by leads.

21. A method for sensing a current in a semiconductor device, the method comprising:
providing a semiconductor device containing a current-carrying component;
providing an on-chip current sensor containing a magnetic resistive element with an initial direction of magnetization, wherein the magnetic resistive element comprises a first conductive layer proximate to the current-carrying component and insulated from said component by an insulating layer; and
measuring the resistance in the magnetic resistive element as the current flows through the current-carrying component.

22. The method of claim 21, wherein the resistance changes due to the magnetic field generated by the flowing current.

23. An electronic apparatus containing an on-chip current sensor for a current-carrying component of a semiconductor device, the sensor comprising a magnetic resistive element that is connected to terminals via leads and that is proximate a portion of the current-carrying component, and wherein the magnetic resistive element changes its resistance depending on the current flowing through the current-carrying component.

24. An electronic apparatus containing a semiconductor device, the semiconductor device comprising:
a MOSFET; and
an on-chip magnetic resistive element proximate the MOSFET, the magnetic resistive element containing a first conductive layer that is connected to terminals via leads and that is proximate the source of the MOSFET, and a second conductive layer proximate the first conductive layer.

25. The semiconductor device of claim 1, wherein the magnetic resistive element can measure both AC and DC currents up to high frequencies ranging from about DC to about several hundred KHz.

26. The semiconductor device of claim 5, wherein the magnetic resistive element changes it resistance based on the magnetic field generated by the current flowing through the MOSFET.

27. The semiconductor device of claim 1, wherein the second conductive layer contains a material with a higher electrical conductivity than the material of the first conductive layer.

28. The semiconductor device of claim 12, wherein the magnetic resistive element can measure both AC and DC currents up to high frequencies ranging from about DC to about several hundred KHz.

29. The semiconductor device of claim 12, wherein the magnetic resistive element changes it resistance based on the magnetic field generated by the current flowing through the MOSFET.

30. The semiconductor device of claim 13, wherein the second conductive layer contains a material with a higher electrical conductivity than the material of the first conductive layer.

31. A semiconductor device, comprising:
a current-carrying component; and
an on-chip magnetic resistive element that is connected to terminals via leads and that is located proximate the current-carrying component that senses the current flowing through the current-carrying component.

* * * * *